(12) United States Patent
Lee et al.

(10) Patent No.: US 7,101,790 B2
(45) Date of Patent: Sep. 5, 2006

(54) METHOD OF FORMING A ROBUST COPPER INTERCONNECT BY DILUTE METAL DOPING

(75) Inventors: Hsien-Ming Lee, Changhua (TW); Hung-Wen Su, Jabei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/402,545

(22) Filed: Mar. 28, 2003

(65) Prior Publication Data

US 2004/0188850 A1     Sep. 30, 2004

(51) Int. Cl.
*H01L 21/44* (2006.01)
(52) U.S. Cl. ............... 438/654; 438/653; 438/658; 438/660; 438/687; 251/E23.161
(58) Field of Classification Search ........ 438/652–654, 438/656, 658, 660, 687; 257/751–753, E23.161
See application file for complete search history.

(56) References Cited

U.S. PATENT DOCUMENTS

| | | | |
|---|---|---|---|
| 6,181,012 B1 | 1/2001 | Edelstein et al. ........... 257/762 |
| 6,258,710 B1 * | 7/2001 | Rathore et al. ............. 438/628 |
| 6,368,954 B1 * | 4/2002 | Lopatin et al. ............. 438/627 |
| 6,426,293 B1 * | 7/2002 | Wang et al. ................ 438/687 |
| 6,479,389 B1 * | 11/2002 | Tsai et al. .................. 438/697 |
| 6,806,192 B1 * | 10/2004 | Lin et al. ................... 438/687 |

* cited by examiner

*Primary Examiner*—Kenneth Parker
*Assistant Examiner*—Matthew C. Landau
(74) *Attorney, Agent, or Firm*—Thomas, Kayden, Horstemeyer & Risley LLP

(57) ABSTRACT

A copper filled semiconductor feature and method of forming the same having improved bulk properties the method including providing a semiconductor process wafer having a process surface including an opening for forming a semiconductor feature; depositing at least one metal dopant containing layer over the opening to form a thermally diffusive relationship to a subsequently deposited copper layer; depositing said copper layer to substantially fill the opening; and, thermally treating the semiconductor process wafer for a time period sufficient to distribute at least a portion of the metal dopants to collect along at least a portion of the periphery of said copper layer including a portion of said copper layer grain boundaries.

21 Claims, 3 Drawing Sheets

METHOD OF FORMING A ROBUST COPPER INTERCONNECT BY DILUTE METAL DOPING

FIELD OF THE INVENTION

This invention generally relates to methods for forming copper filled semiconductor features and more particularly to a method for producing a copper filled semiconductor feature by adding metal dopants including preferential segregation at copper grain boundaries to produce a copper filled semiconductor feature having low resistivity, increased stress and electromigration resistance, and thereby having an increased resistance to copper hillock formation in subsequent thermal processes to improve device reliability.

BACKGROUND OF THE INVENTION

Sub-micron multi-level metallization is one of the key technologies for ultra large scale integration (ULSI). The multilevel interconnects that lie at the heart of this technology require planarization of interconnect features formed in high aspect ratio openings, including contacts, vias, metal interconnect lines and other features. Reliable formation of these interconnect features is very important to the success of ULSI and to the continued effort to increase circuit density and quality on individual substrates and die.

Copper and copper alloys have become the metal of choice for filling sub-micron, high aspect ratio interconnect features on semiconductor substrates. Copper and its alloys have lower resistivity compared to other metals such as, for example, aluminum. These characteristics are critical for achieving higher current densities with increased device speed. Copper, however, has exhibited certain processing problems that must be overcome to achieve a mature copper metal interconnect semiconductor processing technology. For example, copper filled features have been found to have a tendency to form sharp protrusions, otherwise known as hillocks into overlying material layers, for example a nitride layer formed to contact the copper and while subjected to thermal processing temperatures. The cause of the formation of copper hillocks has been thought to be related to thermal mismatch stresses as well as low electromigration resistance and the low strength and ductility of copper which may contribute to the formation of hillocks in a subsequent plasma enhanced and thermal processes.

Other problems associated with copper filled semiconductor features include the fact that copper, for example, electro-chemically deposited copper tends to form relatively large grains in subsequent thermal processes which increases the roughness of surface morphology thereby compromising adhesion of overlying layers. In addition, the tendency of copper to form copper oxides at exposed surfaces at room temperature in the presence of oxygen containing atmospheres presents processing constraints to prevent formation of copper oxides at the surface and penetrating into the copper bulk via grain boundary diffusion. The formation of copper oxides at the copper surface within grain boundaries degrades the overall resistivity of the copper feature and contributes to other reliability problems including reducing adhesion of overlying material layers in contact with the copper feature.

One exemplary process for forming a series of interconnected multiple layers, for example, is a damascene process. Although there are several different manufacturing methods for manufacturing damascene structures, all such methods employ at least two photolithographic masking and etching steps, typically including a reactive ion etch (RIE). In the typical multilayer semiconductor manufacturing process, for example, a series insulating layers are deposited to include a series of interconnecting metallization structures such as vias and trench lines to electrically interconnect different device levels (e.g., vias) and to interconnect various areas within a device level (e.g., trench lines). In most devices, pluralities of vias are separated from one another along a process wafer and selectively interconnect conductive regions between layers of a multi-layer device. Trench lines typically serve to selectively interconnect conductive regions within a layer of a multilayer device. Vias and trench lines formed together, for example a trench line overlying one or more vias is referred to as a dual damascene.

For example, in a typical dual damascene process, an opening is formed by at least two conventional reactive ion etching (RIE) process to first form a via opening in one or more dielectric insulating layers followed by a similar process to form a trench line opening overlying and encompassing one or more via openings to form a dual damascene opening. Prior to filling the dual damascene opening with a metal, for example copper, a barrier layer is deposited to cover the sidewalls and bottom portion of the feature opening to prevent copper diffusion into the dielectric insulating layer and to improve the adhesion of an overlying copper layer filling the feature opening. For example, an electro-chemical deposition (ECD) method also known as electroplating is used to deposit copper since it is a preferable method to achieve superior step coverage in sub-micron feature openings. The method generally includes depositing a metal seed layer, for example copper, over the barrier layer and then electroplating copper over the seed layer to fill a feature opening to form a dual damascene structure. A seed layer is required to carry electrical current for electroplating, the seed layer preferably being continuous over the wafer surface to provide for uniform electro-deposition of copper. The deposited copper layer is then planarized, for example by chemical mechanical polishing (CMP), to define a conductive interconnect feature. Since copper is easily oxidized when exposed to moisture or oxygen containing ambient, typically a protective layer is formed soon after the CMP process defining the copper filled feature.

To overcome the several processing challenges associated with copper technology, prior art processes have proposed depositing a copper alloy seed layer including various metal additives to form a copper alloy over the barrier layer to improve adhesion and electromigration resistance of the copper filled feature. For example, U.S. Pat. No. 6,181,012 proposes forming a copper alloy seed layer prior to forming an overlying copper layer to improve adhesion and electromigration resistance of the overlying copper layer. U.S. Pat. Nos. 5,243,222 and 5,130,274 teach the formation of copper alloys for diffusion barriers. However, none of these processes teach methods of copper feature formation that adequately address problems related to the bulk properties of the copper filled feature including the formation of copper hillocks penetrating into material layers overlying the copper feature. In addition, the prior art processes do not address bulk properties of the copper feature including bulk electromigration, grain boundary oxidation, and adhesion of material layers formed overlying the copper feature. Moreover, prior art processes significantly increase the resistivity of the copper feature making such processes unacceptable for 0.13 micron technologies and below.

These and other shortcomings demonstrate a need in the semiconductor device processing art to develop a method for forming copper filled features with more robust bulk properties including among other properties, resistance to bulk copper electromigration and stress migration, improved adhesion of material layers to the copper feature, and resistance to grain boundary oxidation.

It is therefore an object of the invention to provide a method for forming copper filled features with more robust bulk properties including among other properties, resistance to bulk copper electromigration and stress migration, improved adhesion of material layers to the copper feature, and resistance to grain boundary oxidation while overcoming other shortcomings and deficiencies of the prior art.

SUMMARY OF THE INVENTION

To achieve the foregoing and other objects, and in accordance with the purposes of the present invention, as embodied and broadly described herein, the present invention provides a copper filled semiconductor feature and method of forming the same having improved bulk properties.

In a first embodiment, the method includes providing a semiconductor process wafer having a process surface including an opening for forming a semiconductor feature; depositing at least one metal dopant containing layer over the opening to form a thermally diffusive relationship to a subsequently deposited copper layer; depositing said copper layer to substantially fill the opening; and, thermally treating the semiconductor process wafer for a time period sufficient to distribute at least a portion of the metal dopants to collect along at least a portion of the periphery of said copper layer including a portion of said copper layer grain boundaries.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to a dual damascene structure including copper filled vias and trench lines it will be understood that the method of the present invention is applicable to any copper filled feature formed in a dielectric insulating layer including, for example, bonding pads or single damascene structures where metal dopants are advantageously segregated at the periphery and grain boundaries of the copper feature to form more robust copper features while maintaining a low copper feature resistivity. For example, the method of the present invention advantageously suppresses bulk electromigration and bulk stress migration thereby suppressing copper hillock formation while improving copper feature surface morphology thereby improving adhesion of material layers to the copper bulk. In addition, a grain boundary oxidation resistance is advantageously realized. Unless otherwise indicated the term 'copper' refers to copper and its alloys.

In a first embodiment, at least one metal doping layer is deposited over a feature opening lined with a barrier layer to contact an adjacently deposited metal seed layer. Preferably, the metal seed layer is formed to allow thermal diffusion of the metal dopants into the bulk of the copper filled feature. In one embodiment, the at least one metal doping layer is optionally deposited prior to, or following deposition of a metal seed layer. Preferably, the metal seed layer is substantially pure copper. In another embodiment, the at least one metal doping layer is sandwiched between two metal seed layers. In another embodiment, the at least one metal doping layer is optionally deposited following deposition of a copper layer to fill the feature but prior to a chemical mechanical polishing (CMP) step to planarize the copper filled feature. Following deposition of copper to fill the feature and deposition of the at least one metal doping layer, a thermal annealing treatment is carried out to distribute at least a portion of the metal dopants in the metal doping layer to the copper feature periphery and to segregate at least a portion of the metal dopants to at least a portion of the copper layer grain boundaries.

Figure 1A:
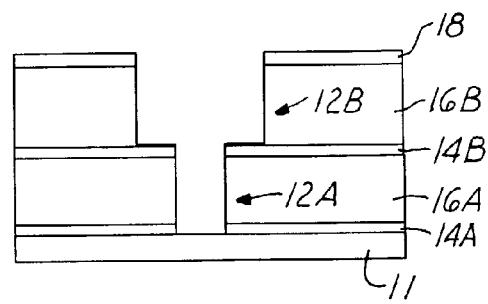
FIG. 1A–1G are cross-sectional side views of a portion of a semiconductor device at stages of manufacture according to embodiments of the present invention.

In an exemplary implementation of an embodiment of the present invention, representative cross sectional side views of a dual damascene or portion thereof at stages in manufacture are shown in FIGS. 1A–1G. Referring to FIG. 1A is shown a typical dual damascene structure having a trench line portion 12B, formed overlying a via portion 12A. The via portion 12A is typically formed first by a photolithographic and reactive ion etching (RIE) step through insulating dielectric layers 16A and 16B, also referred to as inter-metal dielectric (IMD) layers, formed of, for example, fluorinated silicate glass (FSG) or carbon doped silicon oxide (C-oxide). Etching stop layers 14A and 14B, for example formed of silicon nitride (e.g., SiN, $Si_3N_4$), respectively separate underlying conductive area 11 and IMD layer 16A and separate IMD layers 16A and 16B. A bottom anti-reflectance coating (BARC) layer 18, also functioning as an etching mask, for example formed of silicon oxynitride (e.g., SiON) is formed over IMD layer 16B. The via portion 12A and trench line portion 12B are formed by a conventional photolithographic and RIE etching process to first form via portion 12A followed by a similar process to form trench portion 12B overlying and encompassing via portion 12A. It will be appreciated that the trench line portion may be formed overlying one or more vias to form a dual damascene structure.

Figure 1B:
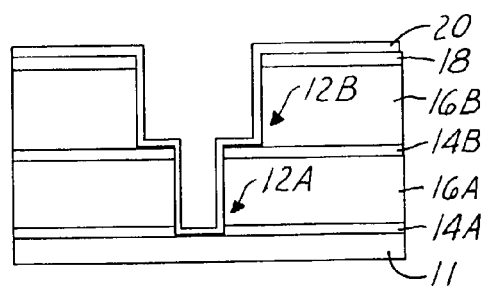

Referring to FIG. 1B a barrier layer 20, for example, including at least one layer of a refractory metal and refractory metal nitride is deposited to line the feature opening to prevent copper diffusion into the IMD layers 16A and 16B. For example, the barrier layer 20 may include a layer of tantalum (Ta), tantalum nitride (TaN), titanium (Ti), titanium nitride (TiN) or silicided titanium nitride (TiSiN). The barrier layer may be a multiple layer structure, for example including a bi-layer of Ta/TaN, Ti/TiN, and Ti/TiSiN. The barrier layer is formed by PVD and or CVD methods, including silicidation and nitridation processes known in the art. Preferably, the barrier layer 20 is formed having a thickness of about 50 Angstroms to about 150 Angstroms.

Figure 1C:
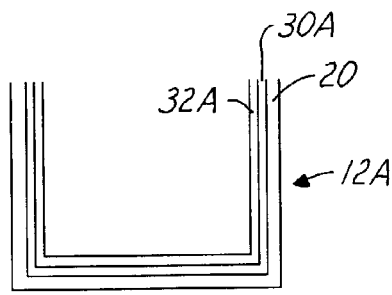

Referring to FIG. 1C, showing an expanded portion of the dual damascene, for clarity, following formation of the barrier layer 20, in one embodiment, a metal doping layer 30A is blanket deposited over the barrier layer 20. In one embodiment, the metal doping layer is preferably deposited as an ultra thin layer having a dopant concentration of about 0.005 weight % to about 0.1 weight % with respect to the metal doping layer 30A plus a subsequently deposited metal seed layer 32A, for example, substantially pure copper. By 'substantially pure' is meant including trace impurities, for example less than about 0.001 weight percent. By 'ultra thin layer' is meant a thickness in the range of about 10 Angstroms to about 300 Angstroms. It will be appreciated that the thickness of the desired metal doping layer will vary depending on the doping level of the metal doping layer and the thickness of the copper seed layer. Preferably, the metal doping layer is formed such that a metal dopant concentration is about 0.005 weight % to about 0.1 weight % with respect to the total atomic weight of a metal doping layer, e.g., 30A plus adjacently deposited copper seed layers, e.g., 32A. For example the metal doping layer may include copper plus an appropriate level of metal dopants to make up the preferred weight percentages of the metal dopants. It has been found by experimentation that the preferred ranges enable the preferred metal dopants to diffuse to the copper feature interfaces (periphery) including copper feature grain boundaries in a subsequent thermal annealing step while maintaining a low electrical resistivity of the copper feature comparable with a substantially pure copper feature. Preferably, the metal doping layer includes one or more of the metal dopants Zr, Mg, Sn, Ag, Ti, Al, Pd, In, Au, Ca, Zn, and Cr.

These metal dopants are preferred for their ability to diffuse through copper bulk in a copper filled feature and segregate at the copper feature interfaces and grain boundaries according to a subsequent thermal annealing treatment in one embodiment of the present invention.

In another embodiment, the metal doping layer is formed substantially of metal dopants where the thickness of the metal doping layer and a seed layer are such that the metal doping layer is about 0.001 weight % to about 0.2 weight % with respect to a total weight (atomic) of the metal doping layer plus adjacently deposited seed layers. In this case, depending on the thickness of the seed layer, which may range from about 500 Angstroms to about 1200 Angstroms, and the type of metal dopant, the metal doping layer may be deposited, for example, having a thickness ranging from about 10 Angstroms to about 50 Angstroms. The metal doping layer is preferably deposited by a conventional PVD or CVD process. For example in a PVD sputter process for example, a collimated sputter process or ionized metal plasma process including one or several targets comprising one or several preferred metal dopants including copper, may be simultaneously sputtered to form a composite metal doping layer. More preferably, an atomic layer CVD (AL-CVD) process is used to form the metal doping layer, for example, having a thickness of less than about 50 Angstroms thick to form a substantially conformal layer. The superior conformality of metal layers deposited by the ALCVD process contributes to optimal distribution of the metal dopants in a subsequent thermal annealing process.

Figure 1D:
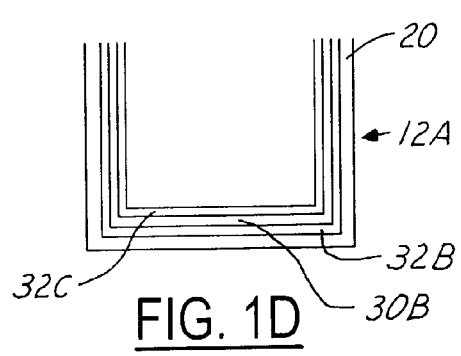
Figure 1E:
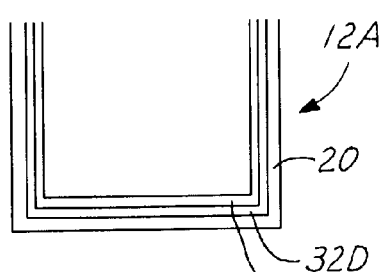

In one embodiment, still referring to FIG. 1C, a metal seed layer 32A, preferably copper, is blanket deposited over the metal doping layer 30A by a PVD and/or CVD process as is known in the art to form a continuous layer over the wafer process surface to form an electro-chemical deposition surface. Referring to FIG. 1D, in another embodiment, a first seed layer 32B is first deposited over the barrier layer 20 followed by deposition of a metal doping layer 30B, followed by another deposition of a seed layer 32C over the metal doping layer. In this embodiment, the metal doping layer includes a concentration of metal dopants of about 0.005 weight % to about 0.1 weight % with respect to the total weight (atomic) of the metal doping layer 30B plus the two adjacent seed layers 32B and 32C. For example, if the the seed layers are substantially pure copper, then the preferred weight percents are about with respect to a total copper weight (atomic) . Referring to FIG. 1E, in another embodiment, a seed layer 32D if first deposited over the barrier layer 20, followed by deposition of a metal doping layer 30D over the seed layer 32D. In this embodiment, the metal doping layer 30D preferably includes copper to improve adhesion of a subsequently deposited copper filling layer, for example by electro-chemical deposition (ECD)

Referring to FIG. 1F, showing again a larger portion of the dual damascene, following deposition of the metal doping layers and seed layers (not shown in FIG. 1F), for example as shown in the embodiment in FIG. 1C, a copper filling layer 34 is deposited to fill the dual damascene semiconductor feature including the via portion and trench portion. The copper layer 34 may be deposited in several ways including physical vapor deposition (PVD) and chemical vapor deposition (CVD) methods but is preferably deposited according to electrochemical deposition (ECD) methods. ECD or electroplating is a preferable method to achieve superior step coverage of sub-micron etched features, for example having about a 0.13 micron line width or less. The method generally includes known electroplating methods including reverse pulse plating copper over a seed layer or metal doping layer, for example a doping layer including copper, to fill the feature opening.

Figure 1F:
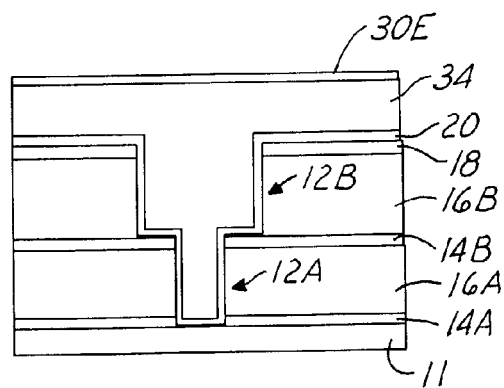
Figure 1G:
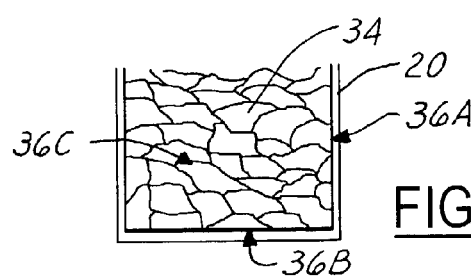

Still referring to FIG. 1F, following deposition of the copper layer 34, in one embodiment, a metal doping layer 30E is optionally deposited overlying the electroplated copper layer 34 as the only metal dopant layer deposited or in addition to the metal doping layers included in the embodiments as shown in FIGS. 1C, 1D, and 1E.

Referring to FIG. 1G, showing again an expanded portion of the dual damascene structure, following copper layer 34 deposition and/or metal doping layer 30E deposition, the process wafer is subjected to a thermal annealing treatment according to an aspect of the invention. Note that the metal doping layer and copper seed layers are not shown in FIG. 1G. According to the thermal treatment, the process wafer is subjected to temperatures preferably less than about 350° C., for example from about 200° C. to about 350° C., to thermally activate diffusion of the metal dopants included in the one or more metal doping layers to diffuse to the copper feature interfaces, e.g., sidewalls 36A, and bottom portion of the feature, e.g., 36B to segregate on the feature side of the barrier layer, to include segregating at the copper layer 34 grain boundaries e.g., 36C. Preferably, the annealing treatment is carried out in a substantially oxidant free atmosphere, for example having a partial pressure of oxidants less than about $10^{-3}$ Torr. The temperature of annealing is important since higher temperature annealing treatments will tend to form copper hillocks prior to adequate distribution of the metal dopants. It will be appreciated that the depicted grains are representative of grains formed in the copper layer 34. It will further be appreciated that metal dopants may be present at the sidewalls the feature prior to the thermal annealing treatment, for example where a metal doping layer is deposited over the barrier layer 20. It will be appreciated that a portion of the metal dopants diffuse both through the bulk of the copper and a portion along the grain boundaries. It will also be appreciated that the appropriate thermal treatment time will vary depending on the annealing temperature and the size of the copper feature including grain size. For example, an appropriate time for annealing the copper features may range from about 30 minutes to about 60 minutes.

The several advantages of the present invention include suppression of grain growth in the copper resulting in smoother copper film morphology, thereby improving adhesion characteristics of the copper feature including to overlying material layers. The suppressed growth of grains is believed to be due to metal dopant segregation at the grain boundaries. Another advantage of the present invention according to preferred metal dopant concentrations is maintaining a copper resistivity within about 10% percent of a substantially pure copper layer.

Figure 2A:
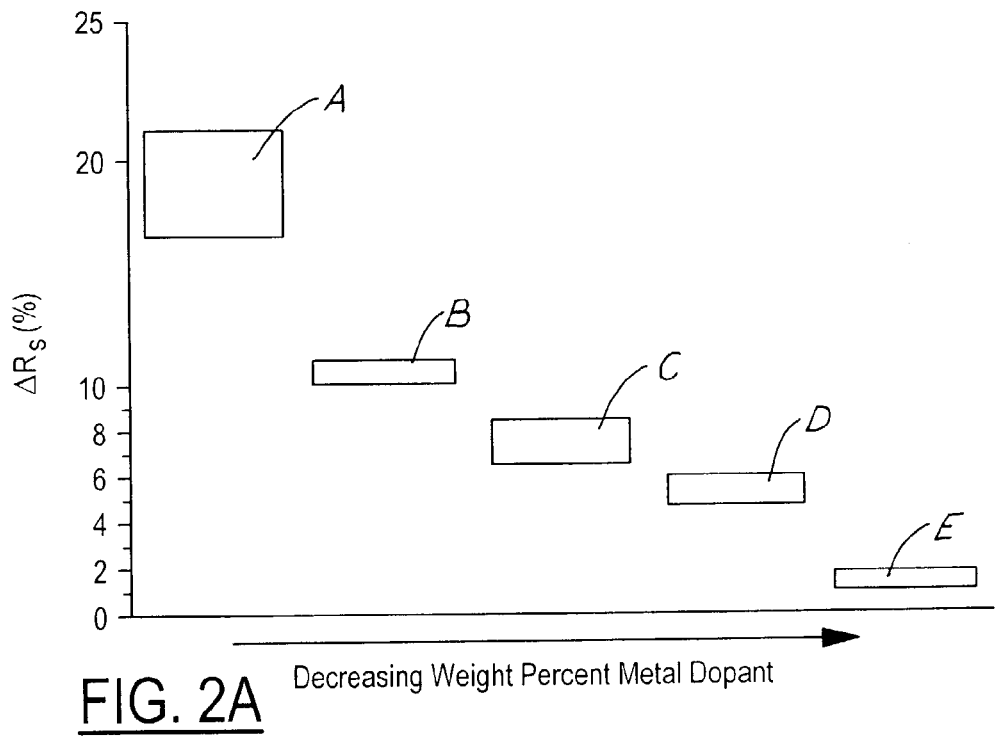
FIG. 2A is a graphical representation of resistivity data including copper features formed according to embodiments of the present invention.

For example, referring to FIG. 2A is shown a graph showing the percent change in resistivity on the vertical axis of copper features relative to a substantially pure copper feature. The horizontal axis is representative of a decreasing weight percent metal dopant magnesium weight percent with respect to metal dopant layers prepared according to preferred embodiments including an annealing step to distribute the metal dopants into the bulk of the copper feature including the periphery and grain boundaries following copper filling deposition. The enclosed areas for samples A through E represent a range of measured resistivity values and Mg weight percentages for the particular sample. In contrast, Sample A includes a Cu(Mg) alloyed seed layer, for example a metal solid solution having about 0.5 weight % Mg, formed prior to deposition of the copper filling and prepared without an annealing process to distribute the Mg into the copper bulk (filling). Samples B through E are prepared according to preferred embodiments including a copper seed layer together with a metal doping formed to have weight percentages of Mg within preferred ranges. For example, about 0.001 weight % Mg for sample E, 0.01 weight % Mg for sample D, 0.05 weight % Mg for sample C, and about 0.1 weight % Mg for sample B.

It is seen in Samples B thru E that following the dopant diffusing annealing treatment according to the present invention, a feature resistivity according to preferred embodiments can be achieved that is within about 10% of a substantially pure copper feature (i.e., 0%). As a result, preparing copper features including a metal doping layer according to preferred embodiments allows design constraints for copper features, for example having a line width of about 0.13 microns or less, to be satisfactorily met. For example, it has been found that copper features having a resistivity greater than about 10 percent of the value of a substantially pure copper feature do not satisfactorily meet design constraints for 0.13 micron technologies and below.

Figure 2B:
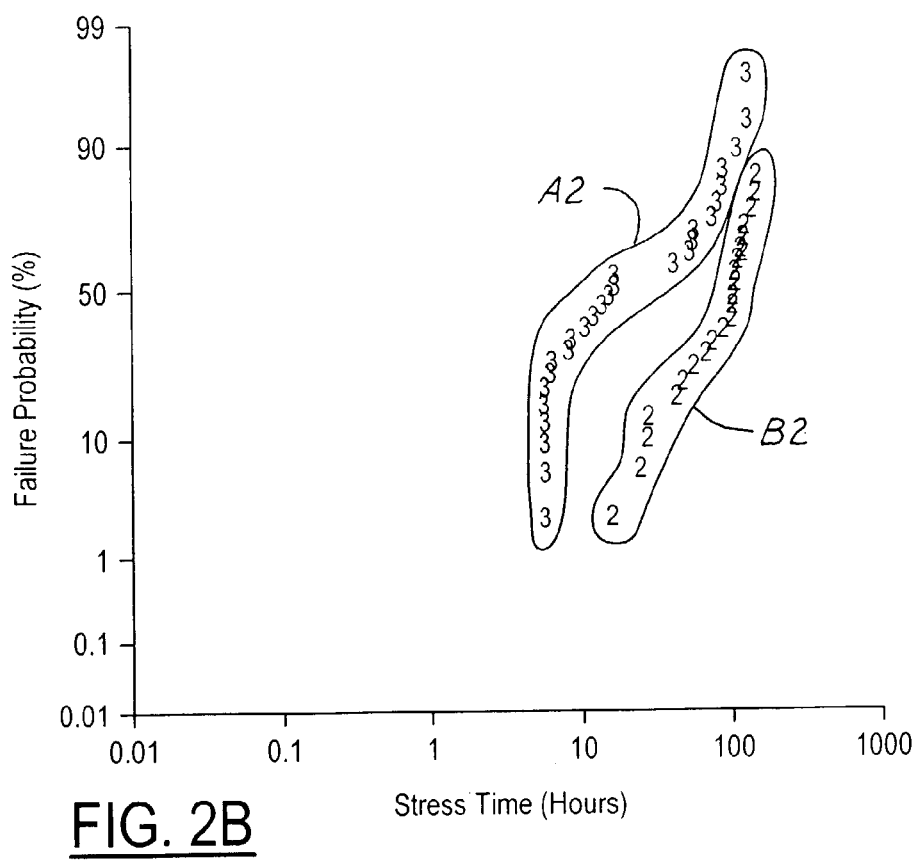
FIG. 2B is a graphical representation of stress failure data including copper features formed according to embodiments of the present invention.

Yet another advantage of the present invention is the increased strength of the copper features, thus increasing a resistance to electromigration and copper hillock formation due to electrical and thermally induced stresses. Referring to FIG. 2B is shown a graph of data obtained according to a stress test showing the failure probability according to a conventional Weibull analysis on the vertical axis versus a stressing time on the horizontal axis according to a conventional stress test. Data from area A2 represents a failure probability according to a control sample including copper features prepared according to the prior art whereas area B2 includes copper features prepared with a metal doping layer followed by an annealing process to distribute the metal dopants according to preferred embodiments of the present invention. It is seen that the stress time to failure for about 50 percent of samples prepared according to an embodiment of the present invention is greater by about an order of magnitude compared to samples prepared according to prior art processes.

Yet an additional advantage of the present invention is increased resistance to oxidation of the copper, particularly where oxidants penetrate into the copper bulk grain boundaries. Such oxidation processes degrade electrical performance and are essentially unable to be removed once formed. For example, if an oxidizing atmosphere is present, for example following a CMP process exposing the copper feature, an oxide layer of material including copper alloy oxides e.g., ($Cu_xM_yO_z$) where M is a metal dopant and x,y, and z, are variable stoichiometric proportions, are formed at the grain copper feature grain boundaries. As a result, formation of high resistivity copper oxides is avoided. As such, copper processing constraints, also known as process windows, may be relaxed, for example, by eliminating the need for, or increasing a process window for adding a protective layer over the exposed copper feature following a CMP process. For example, although not shown, following formation of the copper layer 34 and optional formation of the metal doping layer followed by an annealing process according to preferred embodiments, the excess copper of copper layer 34 above the feature level is removed according to a single or multi-step CMP process as is known in the art including removing the barrier layer 20 overlying the feature level.

Figure 3:
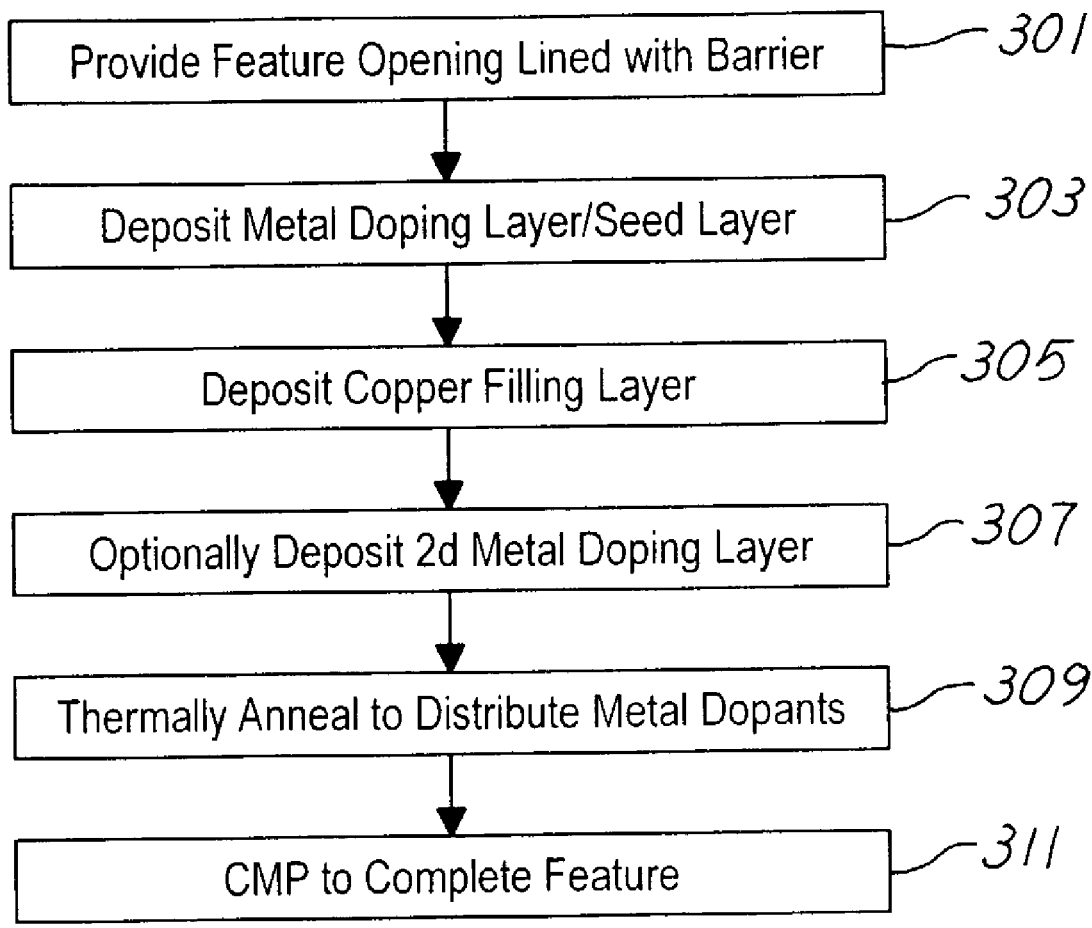
FIG. 3 is a process flow diagram including several embodiments of the present invention.

Referring to FIG. 3 is a process flow diagram including several embodiments of the present invention. In process 301, a semiconductor feature opening is provided lined with a barrier layer. In process 303, at least one metal doping layer and at least one seed layer are deposited according to preferred embodiments. In process 305, the bulk of the copper feature is deposited to fill the feature. In process 307, an optional metal doping layer is deposited over the copper filling layer. In process 309, a thermal annealing process according to preferred embodiments is carried out to distribute the metal dopants. In process 311, a CMP process is carried out to complete formation of the copper filled feature.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming a semiconductor device comprising:
   providing a semiconductor wafer having a process surface comprising an opening for forming an interconnect feature;
   forming at least one first metal dopant layer comprising at least one first metal dopant to line the opening wherein the at least one first metal dopant layer is formed adjacent to at least one copper seed layer, wherein the at least one copper seed layer is formed over the opening prior to the step of forming the at least one first metal dopant layer;
   forming a copper layer to substantially fill the opening;
   forming a second metal dopant layer comprising one or more second metal dopants over the copper layer;
   thermally treating the semiconductor wafer at a temperature for a time period; and
   removing the copper layer and the second metal dopant layer above the opening level.

2. The method of claim 1, wherein the opening is lined with at least one layer of material selected from the group consisting of refractory metals and refractory metal nitrides prior to the step of forming the at least one first metal dopant layer.

3. The method of claim 1, wherein a second copper seed layer is formed over the at least one first metal dopant layer prior to the step of forming said copper layer.

4. The method of claim 1, wherein the step of removing the copper layer and the second metal dopant layer above the opening level is carried out by a CMP process.

5. The method of claim 1, wherein the at least one first metal dopant is selected from the group consisting of Zr, Mg, Sn, Ag, Ti, Al, Pd, In, Au, Ca, Zn, and Cr.

6. The method of claim 5, wherein the at least one first metal dopant is from about 0.001 weight percent to about 0.2 atomic weight percent with respect to a total atomic weight of the at least one first metal dopant layer and the at least one copper seed layer.

7. The method of claim 1, wherein the step of thermally treating is carried out at a temperature of less than about 350 degrees Centigrade in an ambient substantially free of oxidants.

8. The method of claim 1, wherein the at least one first metal dopant layer is formed by an atomic layer chemical vapor deposition process.

9. The method of claim 1, wherein said copper layer is formed by an electro-chemical deposition process.

10. The method of claim 1, wherein following the step of thermally treating, a copper feature is formed having a resistivity value within about 10 percent of a resistivity value of substantially pure copper.

11. The method of claim 1, wherein the at least one first metal dopant layer is deposited at a thickness of from about 10 Angstroms to about 300 Angstroms, and the at least one copper seed layer is formed at a thickness of from about 500 Angstroms to about 1200 Angstroms.

12. The method of claim 1, wherein the at least one first metal dopant layer is formed at a thickness of from about 10 Angstroms to about 50 Angstroms.

13. A method of forming a copper filled feature comprising:
   providing a semiconductor wafer having a process surface comprising one or more dielectric insulating layers and an opening formed therein lined with a barrier layer for forming a copper filled feature;
   forming a first metal dopant layer comprising one or more first metal dopants over the opening to contact at least one adjacently formed copper seed layer, wherein the at least one adjacently formed copper seed layer is formed over the opening prior to the step of forming the first metal dopant layer;
   forming a copper filling layer to substantially fill the opening;
   forming a second metal dopant layer comprising one or more second metal dopants over the copper filling layer;
   thermally treating the semiconductor wafer for a time period; and
   removing the copper filling layer and the second metal dopant layer above the opening level.

14. The method of claim 13, wherein the barrier layer includes a member selected from the group consisting of refractory metals and refractory metal nitrides.

15. The method of claim 13, wherein the first and second metal dopant layers comprise the respective one or more first and second metal dopants selected from the group consisting of Zr, Mg, Sn, Ag, Ti, Al, Pd, In, Au, Ca, Zn, and Cr.

16. The method of claim 15, wherein the first metal dopants are from about 0.001 weight percent to about 0.2 weight percent with respect to a total atomic weight of the first metal dopant layer and the at least one adjacently formed copper seed layer.

17. The method of claim 13, wherein the step of thermally treating is carried out at a temperature of less than about 350 degrees Centigrade in an ambient substantially free of oxidants.

18. The method of claim 13, wherein the first and second metal dopant layers are formed at a thickness of from about 10 Angstroms to about 300 Angstroms, and the at least one adjacently formed copper seed layer is formed at a thickness of from about 500 Angstroms to about 1200 Angstroms.

19. The method of claim 13, wherein at least the first metal dopant layer is formed by an atomic layer chemical vapor deposition method.

20. A method of forming an interconnect feature comprising:
   providing a semiconductor wafer having a process surface comprising one or more dielectric insulating layers and an opening formed therein lined with a barrier layer for forming an interconnect feature;
   forming a first metal dopant layer comprising one or more first metal dopants over the opening to contact at least one adjacently formed copper seed layer which is thicker than the first metal dopant layer;
   forming a copper filling layer to substantially fill the opening;
   forming a second metal dopant layer comprising one or more second metal dopants over the copper filling layer;
   thermally treating the semiconductor wafer for a time period to diffuse at least a portion of one or more of the first and second metal dopants into the copper filling layer to segregate at the copper filling layer grain boundaries; and
   carrying out a CMP process to remove the copper filling layer and the second metal dopant layer above the opening level.

21. A method of forming a copper filled feature comprising:
   providing a semiconductor wafer having a process surface comprising one or more dielectric insulating layers and an opening formed therein lined with a barrier layer for forming a copper filled feature;
   forming a first metal dopant layer comprising one or more first metal dopants over the opening to contact at least one adjacently formed copper seed layer, wherein the first metal dopant layer is formed sandwiched between a first copper seed layer and a second copper seed layer;
   forming a copper filling layer to substantially fill the opening;
   forming a second metal dopant layer comprising one or more second metal dopants over the copper filling layer;
   thermally treating the semiconductor wafer for a time period; and
   removing the copper filling layer and the second metal dopant layer above the opening level.

* * * * *